United States Patent
Kim et al.

(10) Patent No.: US 9,413,379 B2
(45) Date of Patent: Aug. 9, 2016

(54) SUCCESSIVE APPROXIMATION ANALOG-TO-DIGITAL CONVERTERS AND METHODS USING SHIFT VOLTAGE TO SUPPORT OVERSAMPLING

(71) Applicants: Samsung Electronics Co., Ltd., Suwon-si (KR); IUCF-HYU (Industry-University Cooperation Foundation Hanyang University), Seoul (KR)

(72) Inventors: Yun-Jung Kim, Yongin-si (KR); Jong-Boo Kim, Seoul (KR); Oh-Kyong Kwon, Seoul (KR)

(73) Assignees: Samsung Electronics Co., Ltd. (KR); IUCF-HYU (Industry-University Cooperation Foundation Hanyang University) (KR)

( * ) Notice: Subject to any disclaimer, the term of this patent is extended or adjusted under 35 U.S.C. 154(b) by 0 days.

(21) Appl. No.: 14/690,881

(22) Filed: Apr. 20, 2015

(65) Prior Publication Data

US 2015/0303938 A1    Oct. 22, 2015

(30) Foreign Application Priority Data

Apr. 21, 2014 (KR) .................. 10-2014-0047460

(51) Int. Cl.
*H03M 1/12* (2006.01)
*H03M 1/46* (2006.01)
*H03M 1/20* (2006.01)
(Continued)

(52) U.S. Cl.
CPC .............. *H03M 1/468* (2013.01); *H03M 1/201* (2013.01); *H03M 1/00* (2013.01); *H03M 1/12* (2013.01); *H03M 1/123* (2013.01); *H03M 1/804* (2013.01)

(58) Field of Classification Search
CPC .......... H03M 1/00; H03M 1/12; H03M 1/804
USPC ................................. 341/156, 155, 172, 120
See application file for complete search history.

(56) References Cited

U.S. PATENT DOCUMENTS 6,218,976 B1    4/2001    Eklund et al.
6,304,208 B1    10/2001   Nagashima
(Continued)

FOREIGN PATENT DOCUMENTS

| JP | 2011-199403 | 10/2011 |
| KR | 10-0696945 | 3/2007 |
| KR | 10-2009-0026884 | 3/2009 |

*Primary Examiner* — Joseph Lauture
(74) *Attorney, Agent, or Firm* — Myers Bigel & Sibley, P.A.

(57) ABSTRACT

An analog-to-digital converter includes a digital-to-analog converter comprising a capacitor divider network comprising a plurality of dividing capacitors and a dummy capacitor. The digital-to-analog converter is configured to selectively apply an input voltage and a reference voltage to the dividing capacitors and to selectively apply the input voltage and a shift voltage to the dummy capacitor. The analog-to-digital converter further includes a comparison circuit configured to compare an output of the capacitor divider network and a common mode voltage and a shift voltage generator circuit configured to generate the shift voltage. The shift voltage generator circuit may be configured to vary the shift voltage for different samples of the input voltage. For example, the shift voltage generator circuit may be configured to change the shift voltage for succeeding samples by an amount corresponding to $1/(2^{\wedge}M)$ times the reference voltage to support $2^{\wedge}M$ oversampling of the input voltage.

20 Claims, 14 Drawing Sheets

(51) Int. Cl.
*H03M 1/80* (2006.01)
*H03M 1/00* (2006.01)

(56) References Cited

U.S. PATENT DOCUMENTS 6,633,247 B2 10/2003 Yakabe
7,554,479 B2 6/2009 Lim
7,656,338 B2 2/2010 Sano
7,898,453 B2 3/2011 Mathe
8,284,093 B2 10/2012 Kawai
2004/0257256 A1* 12/2004 Leung ............... H03M 1/1057
341/172
2013/0249728 A1 9/2013 Ikeda et al.

* cited by examiner

SUCCESSIVE APPROXIMATION ANALOG-TO-DIGITAL CONVERTERS AND METHODS USING SHIFT VOLTAGE TO SUPPORT OVERSAMPLING

CROSS-REFERENCE TO RELATED APPLICATIONS

This application is based on and claims priority from Korean Patent Application No. 10-2014-0047460, filed on Apr. 21, 2014 in the Korean Intellectual Property Office, the disclosure of which is incorporated herein in its entirety by reference.

BACKGROUND

The present invention relates to analog-to-digital converters and method of operating the same and, more particularly, to successive-approximation analog-to-digital converters methods of operating the same.

An image sensor is a device that converts an optical image into an electrical signal. Recently, with the development of computer industry and communication industry, there is an increasing demand for image sensors having improved performance in various fields including digital cameras, camcorders, personal communication systems (PCS), game machines, security cameras, medical micro cameras, and robots.

SUMMARY

According to some embodiments, an analog-to-digital converter includes a digital-to-analog converter including a capacitor divider network including a plurality of dividing capacitors and a dummy capacitor. The digital-to-analog converter is configured to selectively apply an input voltage and a reference voltage to the dividing capacitors and to selectively apply the input voltage and a shift voltage to the dummy capacitor. The analog-to-digital converter further includes a comparison circuit configured to compare an output of the capacitor divider network and a common mode voltage and a shift voltage generator circuit configured to generate the shift voltage. The shift voltage generator circuit may be configured to vary the shift voltage for different samples of the input voltage. For example, the shift voltage generator circuit may be configured to change the shift voltage for succeeding samples by an amount corresponding to $1/(2^M)$ times the reference voltage to support $2^M$ oversampling of the input voltage.

In some embodiments, respective ones of the dividing capacitors may correspond to respective bits of a digital output of the analog-to-digital converter and the dummy capacitor may have a capacitance substantially the same as a capacitance of a one of the dividing capacitors corresponding to a least significant bit (LSB) of the digital output.

In some embodiments, the digital-to-analog converter includes a plurality of multiplexers, respective ones of which are coupled to respective ones of the dividing capacitors and the dummy capacitor. A register may be coupled to an output of the comparison circuit and configured to provide respective control signals to respective ones of the multiplexers.

In some embodiments, the capacitor divider network may be a split capacitor divider circuit including a bridge capacitor coupling two groups of the dividing capacitors.

In some embodiments, the digital-to-analog converter may be a multi-stage digital-to-analog converter configured to selectively apply first and second reference voltages to the dividing capacitors for respective first and second groups of bits of a digital output of the analog-to-digital converter. The first reference voltage may include a first lower reference voltage and a first upper reference voltage that is higher than the first lower reference voltage by a level of the first reference voltage. The second reference voltage may include a second lower reference voltage that is higher than the first lower reference voltage by a level that is obtained by dividing the level of the first reference voltage by $2^(N/2)$ and a second upper reference voltage that is higher than the first upper reference voltage by a level that is obtained by dividing the level of the first reference voltage by $2^(N/2)$, wherein N is a number of bits of the digital output.

Further embodiments provide analog-to-digital conversion methods including applying a first voltage sample to dividing capacitors and a dummy capacitor of a capacitor divider network of a digital-to-analog converter, applying a first shift voltage to the dummy capacitor and sequentially applying a reference voltage to respective ones of the dividing capacitors and comparing corresponding respective outputs of the capacitor divider network to a common mode voltage to generate a first multi-bit digital output value. The methods further include applying a second voltage sample to dividing capacitors and a dummy capacitor of a capacitor divider network of a digital-to-analog converter, applying a second shift voltage different from the first shift voltage to the dummy capacitor, and sequentially applying the reference voltage to respective ones of the dividing capacitors and comparing corresponding respective outputs of the capacitor divider network to a common mode voltage to generate a second multi-bit digital output value. The second shift voltage may differ from the first shift voltage by an amount corresponding to $1/(2^M)$ times the reference voltage to support $2^M$ oversampling.

According to further embodiments, an analog-to-digital converter includes a digital-to-analog converter including a capacitor divider network and configured to selectively apply an input voltage, a reference voltage and a shift voltage to the capacitor divider network, a comparison circuit configured to compare an output of the capacitor divider network and a common mode voltage to generate a digital output, and a shift voltage generator circuit configured to generate the shift voltage. The shift voltage generator circuit may be configured to vary the shift voltage for different samples of the input voltage. For example, the shift voltage generator circuit may be configured to change the shift voltage for succeeding samples of the input voltage by an amount corresponding to $1/(2^M)$ times the reference voltage to support $2^M$ oversampling of the input voltage.

BRIEF DESCRIPTION OF THE DRAWINGS

Features and advantages of the present invention will be more apparent from the following detailed description taken in conjunction with the accompanying drawings, in which.

DETAILED DESCRIPTION

Figure 1:
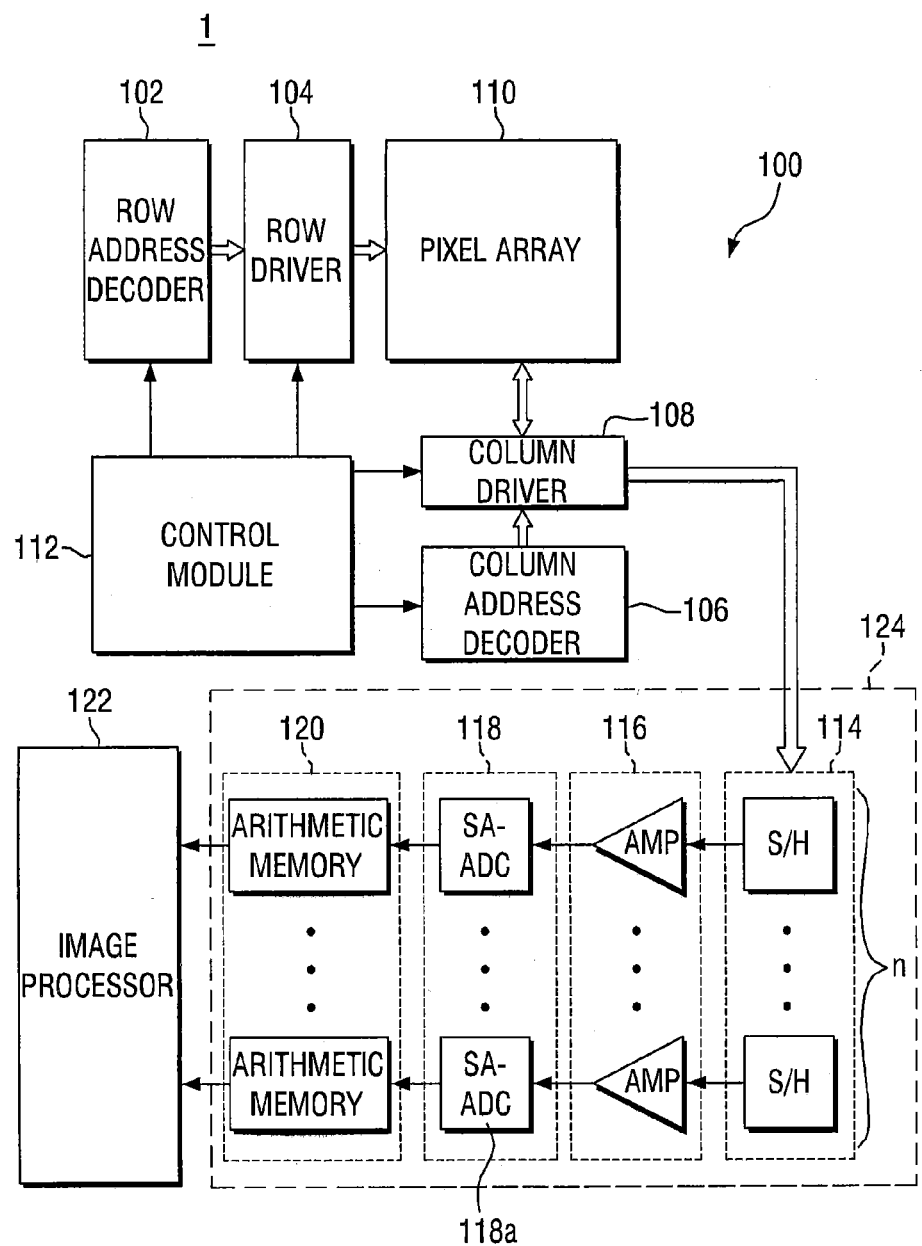
FIG. 1 is a block diagram explaining an image sensor according to some embodiments of the present invention.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, an image sensor according to some embodiments of the present invention will be described with reference to FIG. 1.

FIG. 1 is a block diagram explaining an image sensor according to some embodiments of the present invention.

Referring to FIG. 1, an image sensor 1 according to some embodiments of the present invention includes a pixel array 110, a row driver 104, a column driver 108, a control module 112, a digital correlated double sampling module 124, and an image processor 122.

The pixel array 110 has a plurality of pixels that are arranged in predetermined numbers of rows and columns. Specifically, pixels that are positioned in rows of the pixel array 110 may be simultaneously turned on through row selection lines, and pixel signals of the respective columns may be selectively provided, to output lines through column selection lines. A plurality of row/column selection lines may be provided for the whole pixel array 110.

The row driver 104 selectively activates row lines in response to a row address decoder 102. Further, the column driver 108 selectively activates column selection lines in response to a column address decoder 106. Accordingly, row/column addresses may be provided to the respective pixels of the pixel array 110.

The control module 112 controls the row address decoder 102 and the column address decoder 106 that select appropriate row/column selection lines to read the pixels. Specifically, the control module 112 may control the row driver 104 and the column driver 108 that apply driving voltages to respective drive transistors of the selected row/column selection lines.

The digital correlation double sampling module 124 performs digital correlation double sampling process using a pixel reset signal and a pixel image signal for the selected pixels of the respective columns of the pixel array 110. The digital correlation double sampling module 124 may include a sample and hold (S/H) module 114, an amplifier (AMP) module 116, a successive approximation analog-to-digital converter (SA-ADC) module 118, and an arithmetic memory module 120.

The S/H module 114 may be related to the column driver 108, and may include n S/H devices. Further, each S/H device may sample and hold the pixel reset signal and the pixel image signal for the selected pixels of the pixel array 110. Here, n may include an integer, and may express the number of columns or a part of the columns.

The amplifier module 116 may include n amplifiers and may amplify the sampled and held pixel reset signal and pixel image signal.

The SA-ADC module 118 may include n SA-ADCs, and each SA-ADC may convert the amplified pixel reset signal and pixel image signal into digital signals. The details of the SA-ADC will be described later.

The arithmetic memory module 120 may include n arithmetic memories, and each arithmetic memory may generate a digital difference signal by obtaining a difference between the digital pixel reset signal and the digital pixel image signal using most-significant-bit (MSB)-first calculation. Here, MSB-first calculation may include an addition or subtraction operation including binary operation.

The image processor 122 processes the digital difference signal that is provided from the arithmetic memory module 120 and provides output image color reproduction of an image captured by the plurality of pixels of the pixel array 110.

Specifically, the image processor 122 may perform various operations, and the various operations may include, for example, position gain adjustment, defect correction, noise reduction, optical crosstalk reduction, demosaicing, resizing, and sharpening, but are not limited thereto.

Hereinafter, referring to FIGS. 2 to 5, a successive approximation analog-to-digital converter that may be used in the image sensor system of FIG. 1 according to first embodiments of the present invention will be described.

Figure 2:
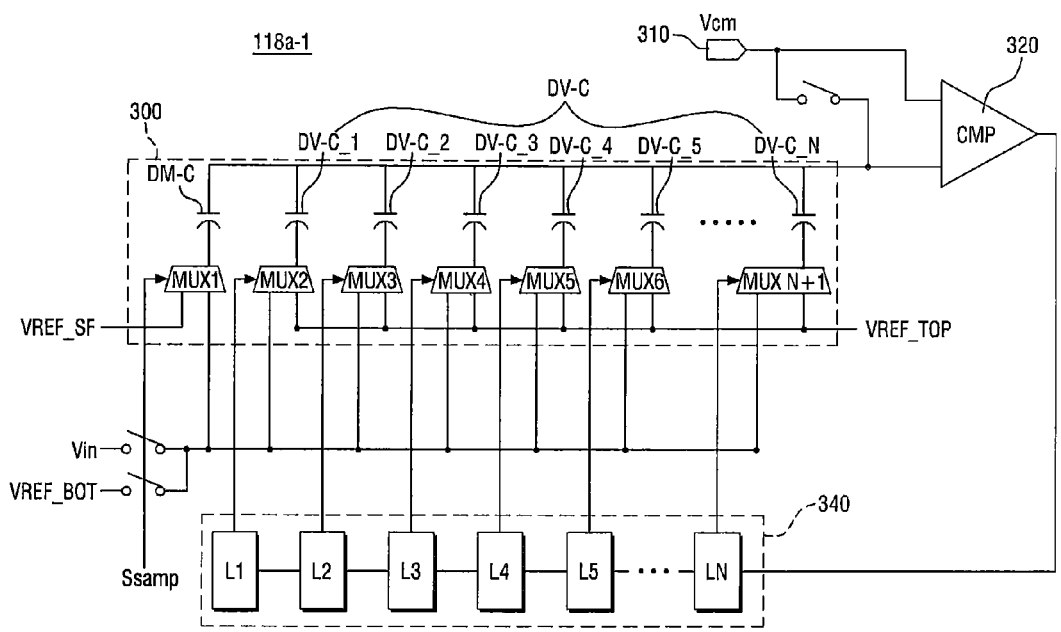
FIG. 2 is a block diagram explaining a successive approximation analog-to-digital converter in FIG. 1 according to first embodiments of the present invention.
Figure 3:
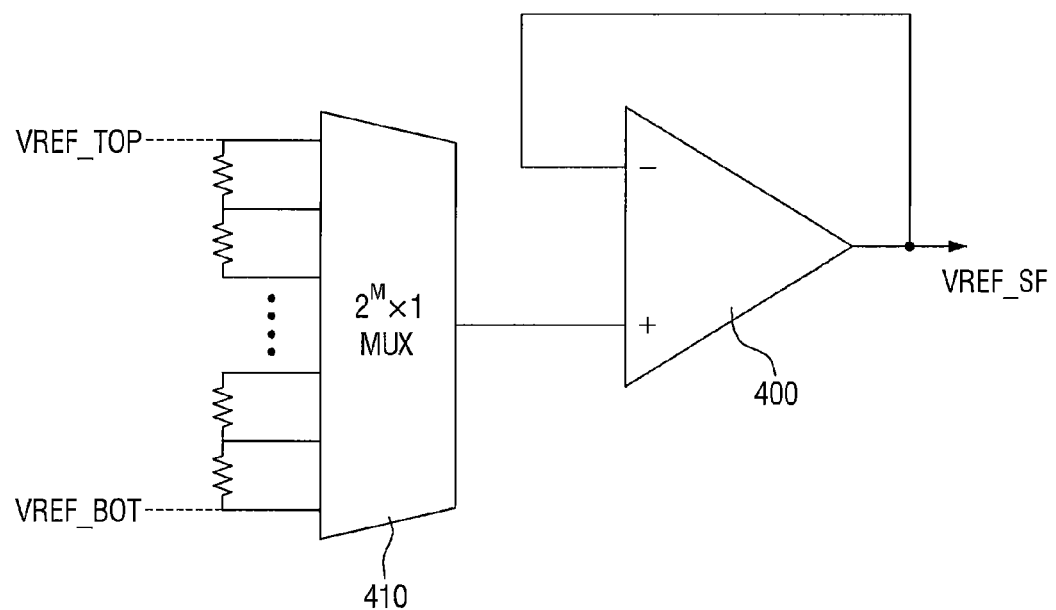
FIG. 3 is a schematic diagram explaining a shift voltage in FIG. 2.
Figure 4:
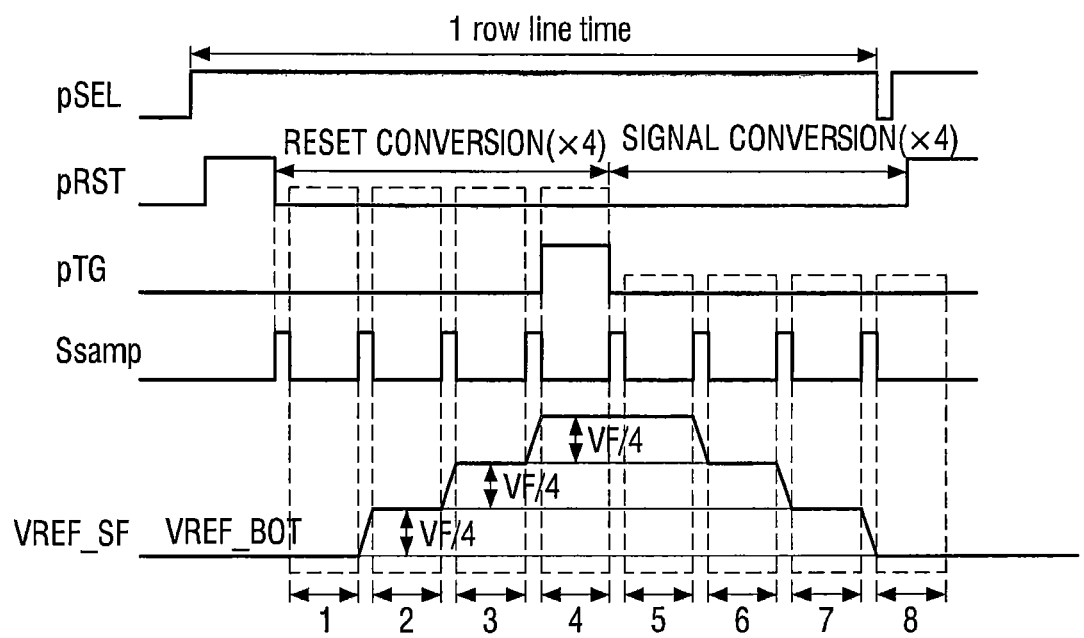
FIG. 4 is a timing diagram of the successive approximation analog-to-digital converter in FIG. 1.
Figure 5:
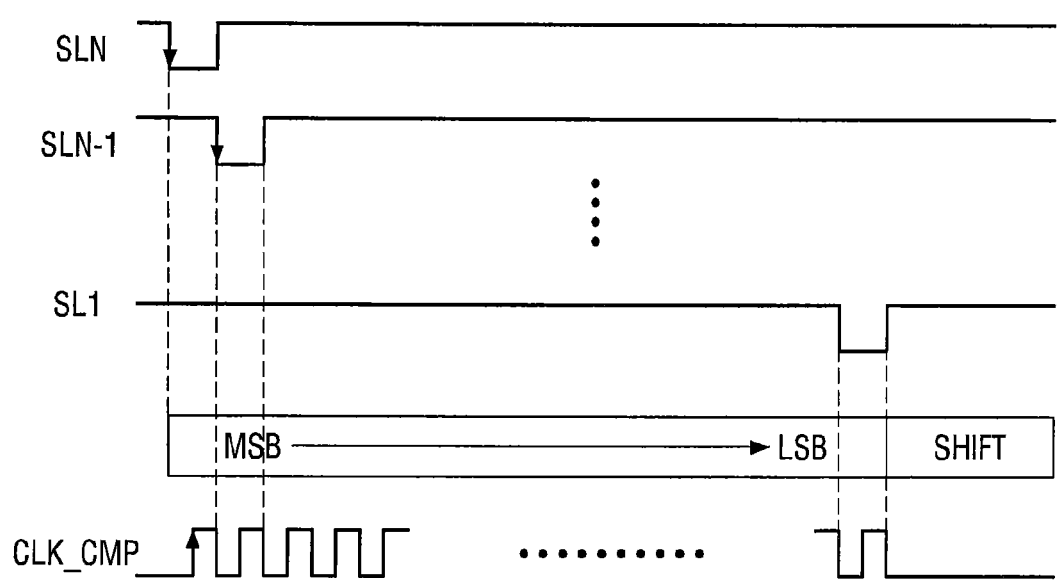
FIG. 5 is a diagram explaining sampling according to clocks in a first period in FIG. 4.

FIG. 2 is a block diagram explaining an implementation of a successive approximation analog-to-digital converter in FIG. 1 according to first embodiments of the present invention, and FIG. 3 is a schematic diagram explaining a shift voltage in FIG. 2. FIG. 4 is a timing diagram of the successive approximation analog-to-digital converter in FIG. 1, and FIG. 5 is a diagram explaining sampling according to clocks in a first period in FIG. 4.

First, referring to FIG. 2, the successive approximation analog-to-digital converter 118a_1 according to first embodiments may include an N (where N is a natural number that is equal to or larger than "2")-bit digital-to-analog conversion circuit 300, a comparison circuit (CMP) 320, and a register circuit 340.

The N-bit digital-to-analog conversion circuit 300 may receive a reference voltage and may receive an N-bit digital output from the register circuit 340. An output of the N-bit digital-to-analog conversion circuit 300 may be provided to the comparison circuit 320.

Specifically, the N-bit digital-to-analog conversion circuit 300 may include a capacitor divider network including dividing capacitors DV-C_1 to DV-C_N receiving reference voltages VREF_BOT and VREF_TOP and an input voltage Vin and a dummy capacitor DM-C receiving the input voltage Vin and a shift voltage VREF_SF. The N-bit digital-to-analog conversion circuit further includes a plurality of multiplexers MUX1 to MUX+1 connected to the dividing capacitor DV-C, the dummy capacitor DM-C and the register circuit 340. The reference voltages may include a lower reference voltage VREF_BOT and an upper reference voltage VREF_TOP, and the reference voltage may have a level that corresponds to a difference between the upper reference voltage VREF_TOP and the lower reference voltage VREF_BOT.

The shift voltage VREF_SF may shift at a rate and in increments commensurate with the degree of oversampling of the input voltage Vin. If the oversampling of the input voltage Vin is $2^M$ (where, M is a natural number), the shifting rate may be $2^M$. Further, if the degree of oversampling of the input voltage Vin is $2^M$ (where, M is a natural number), $2^M$ different shift voltages may be provided. The fact that the number of times the input voltage Vin is sampled is $2^M$ (where, M is a natural number) means that the successive approximation analog-to-digital converter 118a_1 according to the first embodiments outputs an (N+M)-bit digital signal with respect to the input voltage Vin. That is, the (N+M)-bit digital signal is implemented by increasing the N-bit digital signal by M bits.

Referring to FIG. 3, the multiplexer 410 may select the shift voltage VREF_SF that is provided to the dummy capacitor DM-C among the plurality of shift voltages through the first multiplexer MUX1. Specifically, if the number of times the input voltage Vin is sampled is $2^M$ (where, M is a natural number), the multiplexer 410 may select and provide one of $2^M$ shift voltages to the dummy capacitor DM-C. For example, during the first sampling of the input voltage Vin, the first multiplexer may receive the lower reference voltage VREF_BOT as the shift voltage VREF_SF, and during the next sampling, the first multiplexer may provide a voltage that is higher than the lower reference voltage VREF_BOT by (upper reference voltage−lower reference voltage)/$2^M$ as the shift voltage VREF_SF. During further next sampling, the first multiplexer may provide a voltage that is higher than the lower reference voltage VREF_BOT by 2*(upper reference voltage−lower reference voltage)/$2^M$ as the shift voltage VREF_SF. That is, the multiplexer 410 may provide the selected shift voltage VREF_SF to a transfer device 400, and the transfer device 400 may transfer the shift voltage VREF_SF to the dummy capacitor DM-C through the first multiplexer MUX1. Hereinafter, a difference between the upper reference voltage and the lower reference voltage (=upper reference voltage−lower reference voltage) is called a level VF of the reference voltage.

Referring again to FIG. 2, the dividing capacitor DV-C may include N dividing capacitors DV-C_1 to DV-C_N, and the N dividing capacitors DV-C_1 to DV-C_N may divide the level VF of the reference voltage into N different offset voltages. Further, the N dividing capacitors DV-C_1 to DV-C_N may divide the reference voltages VREF_BOT and VREF_TOP and may provide offset voltages to the comparison circuit 320.

Specifically, N offset voltages may include offset voltages that are reduced in stages by ½ times from the offset voltage having a level that is obtained by dividing the level VF of the reference voltage by 2 to the offset voltage having a level that is obtained by dividing the level VF of the reference voltage by $2^N$. Further, if the dividing capacitor that corresponds to the MSB among the N dividing capacitors DV-C_1 to DV-C_N, for example, the N-th dividing capacitor DV-C_N, receives the reference voltages VREF_BOT and VREF_TOP, the offset voltage that is obtained by dividing the level VF of the reference voltage by 2 may be applied to the N-th dividing capacitor DV-C_N. Further, if the dividing capacitor that corresponds to the bit that is next to the MSB, for example, the (N−1)-th dividing capacitor DV-C_N−1, receives the reference voltages VREF_BOT and VREF_TOP, the offset voltage that is obtained by dividing the level VF of the reference voltage by $2^2$ may be applied to the (N−1)-th dividing capacitor DV-C_N−1. Further, if the dividing capacitor that corresponds to the LSB, for example, the first dividing capacitor DV-C_1, receives the reference voltages VREF_BOT and VREF_TOP, the offset voltage that is obtained by dividing the level VF of the reference voltage by $2^N$ may be applied to the first dividing capacitor DV-C_1. The process of dividing the reference voltages VREF_BOT and VREF_TOP through the dividing capacitor DV-C and providing the divided reference voltages to the comparison circuit 320 will be described in detail later.

The dummy capacitor DM-C may receive the shift voltage VREF_SF, and may include a single capacitor having the same capacitance as the LSB.

Specifically, the dummy capacitor DM-C receives the shift voltage VREF_SF that is shifted to the extent that the level VF of the reference voltage is divided by $2^M$ during every sampling of the input voltage Vin, and thus N dividing capacitors DV-C_1 to DV-C_N of the N-bit digital-to-analog conversion circuit 300 may be entirely offset by the LSB.

Further, since the converted shift voltage VREF_SF is applied only to the dummy capacitor DM-C having the same capacitance as the LSB during every sampling, the dummy capacitor DM-C can be sufficiently settled during the sampling of the input voltage Vin.

The plurality of multiplexers MUX1 to MUXN+1 may include a first multiplexer MUX1 connected to the dummy capacitor DM-C, and second to (N+1)-th multiplexers MUX2 to MUXN+1 respectively connected to N dividing capacitors DV-C_1 to DV-C_N.

Specifically, the second to (N+1)-th multiplexers MUX2 to MUXN+1 among the plurality of multiplexers MUX1 to MUXN+1 may be respectively connected to N registers L1 to LN to receive and provide the reference voltages VRFF_BOT and VREF_TOP and the input voltage Vin to the N dividing capacitors DV-C_1 to DV-C_N.

Further, the first multiplexer MUX1 among the plurality of multiplexers MUX1 to MUXN+1 may receive and provide the input voltage Vin and the shift voltage VREF_SF to the dummy capacitor DM-C, may receive a sampling start signal Ssamp, and may provide a shift voltage VREF_SF that is different from the previous shift voltage VREF_SF to the first multiplexer MUX1.

The comparison circuit 320 compares an output of the N-bit digital-to-analog conversion circuit 300 with the input voltage Vin that is targeted for analog-to-digital conversion.

Specifically, the comparison circuit 320 may compare the output of the N-bit digital-to-analog conversion circuit 300, i.e., the offset voltage, with the input voltage Vin that is provided from a terminal 310 of a common mode voltage Vcm. The comparison circuit 320 may output "0" if the offset voltage is higher than the input voltage Vin, and may output "1" if the offset voltage is lower than the input voltage Vin. Further, the output values may be stored in respective registers of the register circuit 340, starting from the MSB. The register circuit 340 includes N registers.

Specifically, the register circuit 340 may include N registers L1 to LN, and the N registers L1 to LN may be respectively connected to the second to (N+1)-th multiplexers MUX2 to MUXN+1. Further, the N registers L1 to LN may receive the output of the comparison circuit 320, and may successively store "0" or "1" in the order of the N-th register LN to the first register L1. Depending on what value is stored in the respective register, the level of the offset voltage that is finally stored in the respective dividing capacitors may be determined. For example, if "1" is stored in the N-th register LN, the (N+1)-the multiplexer MUXN+1 may receive a signal indicating that "1" is stored in the N-th register LN, and may finally apply the upper reference voltage VREF_TOP to the N-th dividing capacitor DV-C_N. In contrast, if "0" is stored in the N-th register LN, the (N+1)-th multiplexer MUXN+1 may receive a signal indicating that "0" is stored in the N-th register LN, may finally apply the lower reference voltage VREF_BOT to the N-th diving capacitor DV-CN. Further, one bit may be stored in each register.

Referring to FIGS. 2 and 4, a timing diagram of the successive approximation analog-to-digital converter according to first embodiments is illustrated. For the timing diagram of FIG. 4, it is assumed that the input voltage Vin is oversampled four times. Of course, the number of times the input voltage is oversampled according to some embodiments of the present invention is not limited to four times.

First, a pixel selection sign pSEL for selecting one pixel of a pixel array 110 of FIG. 1 goes to a high state. Thereafter, a reset applying signal pRST for applying a reset signal for the selected pixel to the successive approximation analog-to-digital converter 118a_1 according to the first embodiments may go to a high state. If the reset applying signal pRST goes to a high state to apply the reset signal to the successive approximation analog-to-digital converter 118a_1 and then the reset applying signal pRST goes to a low state, a sampling start signal Ssamp goes to a high state, and sampling of the input voltage Vin (i.e., reset signal) may start. Further, if the sampling start signal Ssamp goes to a high state, the input voltage Vin may be provided to a dummy capacitor DM-C. If the sampling start signal Ssamp goes from a high state to a low state, a shift voltage VREF_SF may be provided to the dummy capacitor DM-C until the sampling start signal Ssamp goes again to a high state. Further, if the sampling start signal Ssamp goes to a high state, a shift voltage VREF_SF that is different from the previous shift voltage VREF_SF may be provided to the dummy capacitor DM-C. By repeating this process four times, an image signal is oversampled four times.

Thereafter, if image applying signal pTG goes to a high state and then image applying signal pTG goes again to a low state after image signal is applied to the successive approximation analog-to-digital converter 118a_1, sampling start signal Ssamp goes to a high state and then sampling of input voltage Vin (that is, image signal) may be started. Further, if sampling start signal Ssamp goes to a high state, the input voltage Vin may be provided to the dummy capacitor (DM-C). If sampling start signal Ssamp goes to a low state from a high state, shift voltage VREF_SF may be provided to the dummy capacitor DM-C before being a high state. Further sampling start signal Ssamp goes to a high state, the shift voltage VREF_SF different from previous shift voltage VREF_SF may be provided to the dummy capacitor DM-C. By repeating this process four times, an image signal is oversampled four times.

Here, it can be known that when the reset signal is oversampled four times, the shift voltage VREF_SF is increased through shifting three times by a voltage VF equal to ¼ of the reference voltage level, starting from the lower reference voltage VREF_BOT. When the image signal is oversampled four times, the shift voltage VREF_SF is provided as it is as the previous shift voltage VREF_SF at the first sampling of the image signal, and then is shifted three times by the voltage VF from the next sampling.

The shift voltage VREF_SF may be incrementally increased to support oversampling of the reset signal and may be incrementally decreased to support oversampling of the image signal, but is not limited thereto. In other embodiments, the shift voltage VREF_SF may be incrementally increased and decreased during oversampling of the reset signal and the image signal. Further, the shift voltage VREF_SF may be incrementally decreased during oversampling of the reset signal and may be incrementally increased during oversampling of the image signal. In further embodiments, the shift voltage VREF_SF may vary according to other sequences, e.g., for the illustrated example of FIG. 4, the shifts between successive samples may be greater than ¼ of the reference voltage. However, the successive approximation analog-to-digital converter may operate more stably with smaller incremental changes in the shift voltage VREF_SF.

Referring to FIG. 5, a detailed timing diagram for a first period in FIG. 4 is illustrated. Prior to the explanation of the timing diagram of FIG. 5, the operation principle of the successive approximation analog-to-digital converter 118a_1 according to the first embodiments will be briefly described with reference to FIG. 2.

First, the input voltage Vin and a common mode voltage Vcm are provided to the N-bit digital-analog conversion circuit 300 to charge the N dividing capacitors DV-C_1 to DV-C_N. Thereafter, if switches provided between the common mode voltage terminal 310 and the N dividing capacitors DV-C_1 to DV-C_N are turned off, a voltage that corresponds to (common mode voltage Vcm–input voltage Vin) is floated in each of the N dividing capacitors DV-C_1 to DV-C_N. If the lower reference voltage VREF_BOT is applied to the N dividing capacitors DV-C_1 to DV-C_N in this state, a voltage that corresponds to (common mode voltage Vcm–input voltage Vin+lower reference voltage VREF_BOT) is applied to each of the N dividing capacitors DV-C_1 to DV-C_N.

If the N-th register signal LN that is applied to the (N+1)-th multiplexer MUXN+1 goes to a low state in a state where the voltage that corresponds to (common mode voltage Vcm— input voltage Vin+lower reference voltage VREF_BOT) is applied to the N dividing capacitors DV-C_1 to DV-C_N, the (N+1)-th multiplexer MUXN+1 selects and provides the upper reference voltage VREF_TOP to the N-th dividing capacitor DV-C_N, and the N-th dividing capacitor DV-C_N may divide the level VF of the reference voltage into a half. That is, if the upper reference voltage VREF_TOP is provided to the N-th dividing capacitor DV-C_N, an offset voltage that is obtained by dividing the level VF of the reference voltage by 2 is applied to the N-th dividing capacitor DV-C_N, and such an offset voltage may be provided to the comparison circuit 320.

The comparison circuit 320 may receive the offset voltage that is obtained by dividing the level VF of the reference voltage by 2 from the N-th dividing capacitor DV-C_N and may receive the common mode voltage Vcm from the common mode voltage terminal 310. At this time, a comparison clock signal CLK_CMP that is applied to the comparison circuit 320 goes to a high state, and thus the comparison circuit 320 compares the offset voltage that is obtained by dividing the level VF of the reference voltage by 2 with the common mode voltage Vcm. If the offset voltage is higher than the common mode voltage Vcm; the comparison circuit 320 may output "0", while if the offset voltage is lower than the common mode voltage Vcm, the comparison circuit 320 may output "1". The comparison clock signal CLK_CMP goes to a low state when the next register signal goes to a low state to return to a standby state for the next comparison operation. Further, the output of the comparison circuit 320 may be stored in the N-th register LN. If "0" is provided to the N-th register LN, the N-th register may make the (N+1)-th multiplexer MUXN+1 select the lower reference voltage VREF_BOT, while if "1" is provided to the N-register LN, the N-th register LN may make the (N+1)-th multiplexer MUXN+1 select the upper reference voltage VREF_TOP. Accordingly, if "0" is stored in the N-th register LN, the lower reference voltage VREF_BOT may be finally applied to the N-th dividing capacitor DV-C_N, while if "1" is stored in the N-th register LN, the upper reference voltage VREF_TOP may be finally applied to the N-th dividing capacitor DV-C_N. As can be known through the above-described description, the MSB of the input voltage Vin is stored in the N-th register LN.

If the N-th register signal SLN goes again to a high state, the (N–1)-th register signal SLN–1 that is applied to the N-th multiplexer MUXN may go to a low state. Further, if the (N–1)-th register signal SLN–1 goes to a low state, the N-th multiplexer MUXN may select and provide the upper reference voltage VREF_TOP to the (N–1)-th dividing capacitor DV-C_N–1, and the (N–1)-th dividing capacitor DV-C_N–1 may divide the level VF of the reference voltage into ¼. That is, if the upper reference voltage VREF_TOP is provided to the (N–1)-th dividing capacitor DV-C_N–1, an offset voltage that is obtained by dividing the level VF of the reference voltage by 4 may be applied to the (N–1)-th dividing capacitor, and such an offset voltage may be provided to the comparison circuit 320.

The comparison circuit 320 may receive the offset voltage that is obtained by dividing the level VF of the reference voltage by 4 from the (N–1)-th dividing capacitor DV-C_N–1 and may receive the input voltage Vin from the common mode voltage terminal 310. At this time, the comparison clock signal CLK_CMP that is applied to the comparison circuit 320 goes again to a high state, and thus the comparison circuit 320 compares the offset voltage that is obtained by dividing the level VF of the reference voltage by 4 with the common mode voltage Vcm. If the offset voltage is higher than the common mode voltage Vcm, the comparison circuit 320 may output "0", while if the offset voltage is lower than the common mode voltage Vcm, the comparison circuit 320 may output "1". The comparison clock signal CLK_CMP goes to a low state when the next register signal goes to a low state to return to a standby state for the next comparison operation. Further, the output of the comparison circuit 320 may be stored in the (N–1)-th register LN–1. If "0" is provided to the (N–1)-th register LN–1, the (N–1)-th register may make the N-th multiplexer MUXN select the lower reference voltage VREF_BOT, while if "1" is provided to the (N–1)–register LN–1, the (N–1)-th register LN–1 may make the N-th multiplexer MUXN select the upper reference voltage VREF_TOP. Accordingly, if "0" is stored in the (N−1)-th register LN−1, the lower reference voltage VREF_BOT may be finally applied to the (N−1)-th dividing capacitor DV-C_N−1, while if "1" is stored in the (N−1)-th register L−1, the upper reference voltage VREF_TOP may be finally applied to the (N−1)-th dividing capacitor DV-C_N−1. As can be known through the above-described description, the bit next to the MSB of the input voltage Vin is stored in the (N−1)-th register LN−1.

As described above, all the bits from the MSB to the LSB may be successively determined through the comparison process by the comparison circuit 320, and the determined bits may be stored in the first to the N-th registers LN.

Further, if the sampling of the input voltage Vin is finished, as illustrated in FIG. 4, the sampling start signal Ssamp between period 1 and period 2 may go to a high state, and the first multiplexer MUX1 may select the shift voltage VREF_SF that is different from the shift voltage VREF_SF at the previous sampling to provide the selected shift voltage VREF_SF to the dummy capacitor DM-C. The sampling process in period 1 as illustrated in FIG. 4 may be applied to the period 2 to period 8 in the same manner, an for convenience in explanation, the sampling process at other periods.

As described above, through four times oversampling with respect to the reset signal and the image signal, the input voltage Vin may be converted into a digital code of (N+2) bits. That is, according to the successive approximation analog-to-digital converter 118a_1 according to the first embodiments of the present invention, the input voltage Vin may be oversampled 4 times to be converted into (N+2)-bit digital signal.

According to the successive approximation analog-to-digital converter 118a_1 according to the first embodiments of the present invention, the (N+M)-bit digital signal is implemented through performing of N-bit analog-to-digital conversion $2^M$ times, and thus the capacitor area of the digital-to-analog conversion circuit can be reduced. Further, since the input voltage Vin is sampled $2^M$ times, random noise of the pixels can be reduced. Further, due to the characteristic that the reference voltage VREF_BOT or VREF_TOP is divided by the N-bit digital-to-analog conversion circuit 300, it is enough to convert the shift voltage VREF_SF to the extent that the level VF of the reference voltage is divided by $2^M$. The successive approximation analog-to-digital converter 118a_1 may achieve these benefits without having to use an overly fine shift increment.

Hereinafter, referring to FIG. 6, a successive approximation analog-to-digital converter of FIG. 1 according to second embodiments of the present invention will be described.

Figure 6:
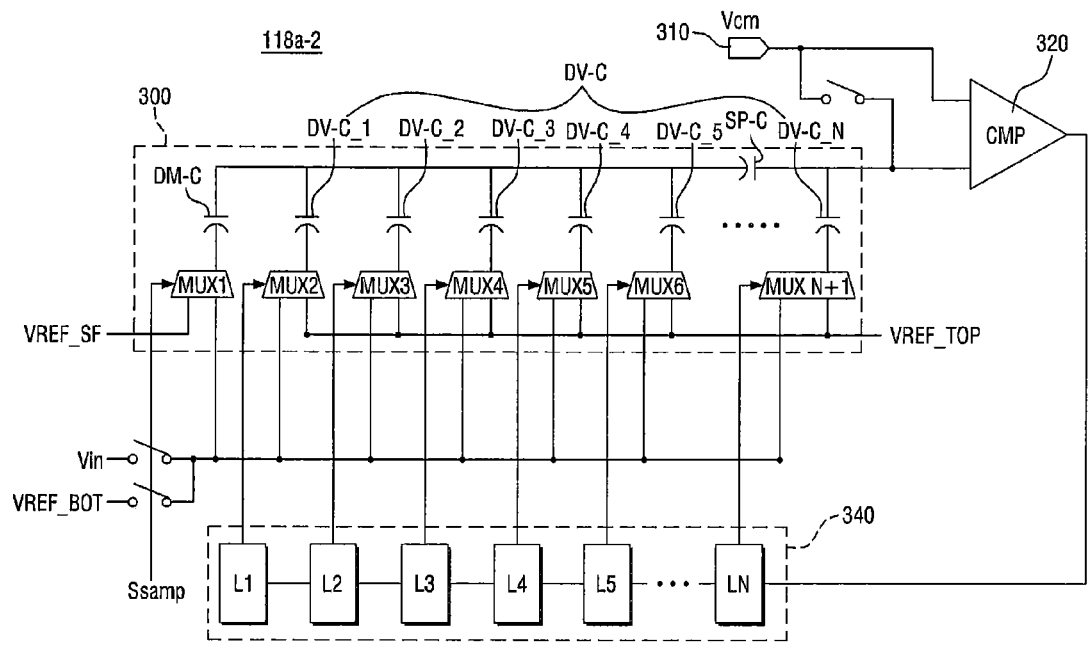
FIG. 6 is a block diagram explaining a successive approximation analog-to-digital converter in FIG. 1 according to second embodiments of the present invention.

FIG. 6 is a block diagram explaining a successive approximation analog-to-digital converter in FIG. 1 according to second embodiments of the present invention. For convenience in explanation, explanation of the duplicate contents to the first embodiments as described above will be omitted.

Referring to FIG. 6, a successive approximation analog-to-digital converter 118a_2 according to second embodiments of the present invention may further include one dividing capacitor SP-C between N dividing capacitors DV-C_1 to DV-C_N.

The dividing capacitor SP-C may serve to divide the N dividing capacitors DV-C_1 to DV-C_N into two groups, and the capacitance of the dividing capacitor SP-C may include $(2^{(N/2)})/((2^{(N/2)})-1)C$. Since the dividing capacitor SP-C exists to reduce the maximum capacitance values of the divided groups, necessary capacitor areas can be reduced. The more detailed explanation of the dividing capacitor SP-C will be omitted.

Hereinafter, referring to FIGS. 7 to 10, a successive approximation analog-to-digital converter of FIG. 1 according to third embodiments of the present invention will be described.

Figure 7:
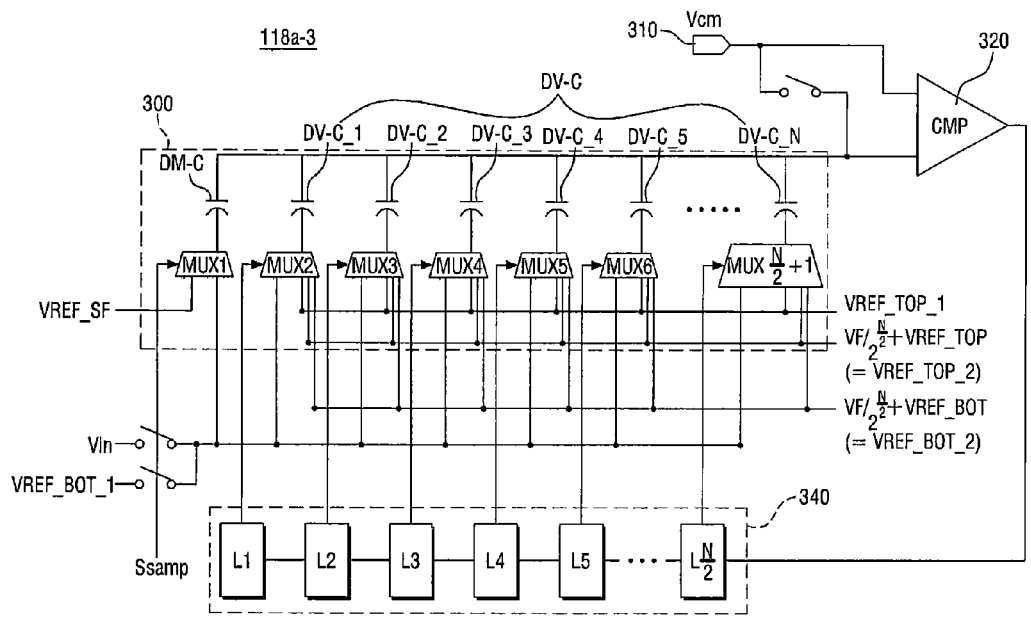
FIG. 7 is a block diagram explaining a successive approximation analog-to-digital converter in FIG. 1 according to third embodiments of the present invention.
Figure 8:
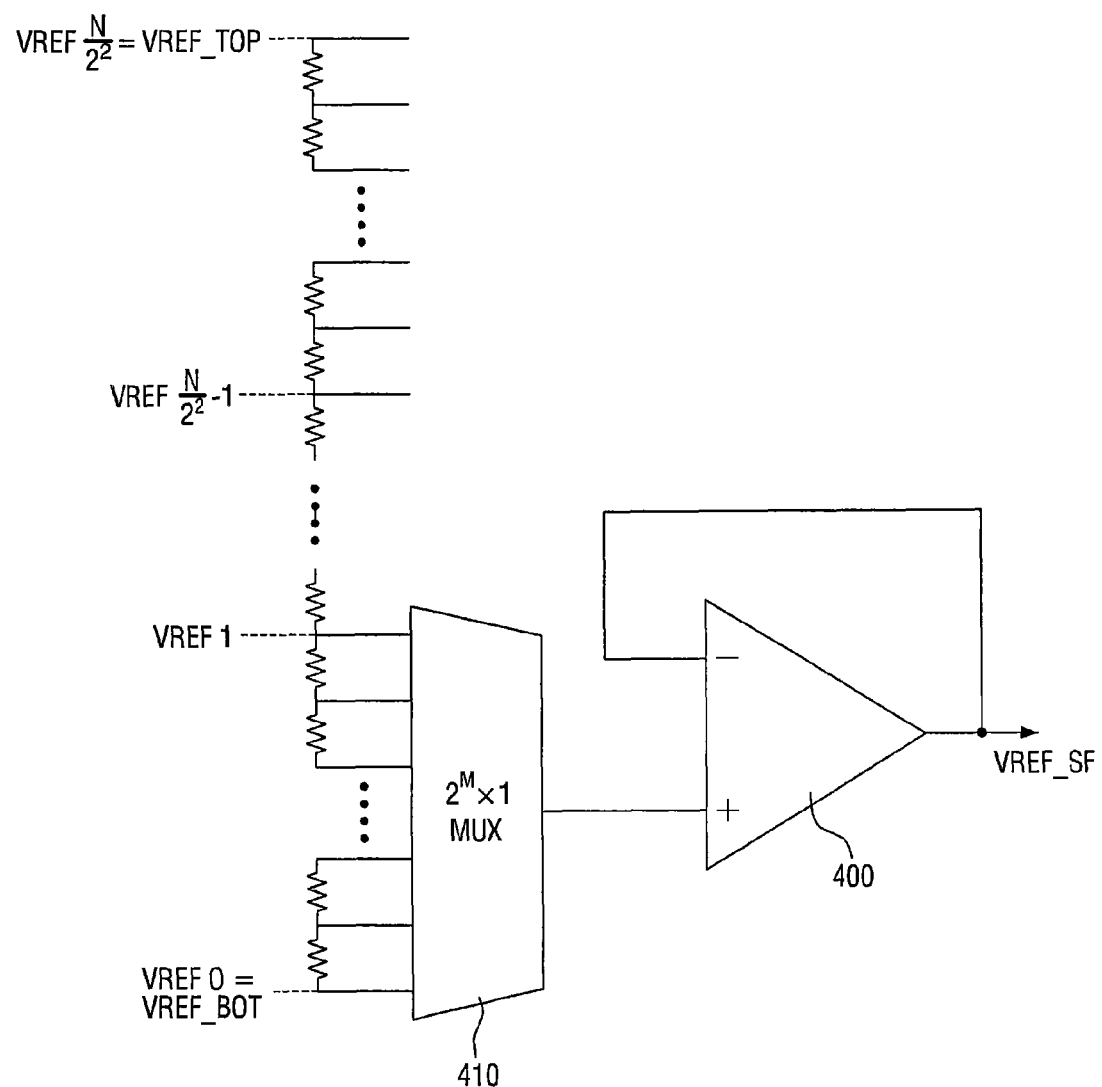
FIG. 8 is a schematic diagram explaining a shift voltage in FIG. 7.
Figure 9:
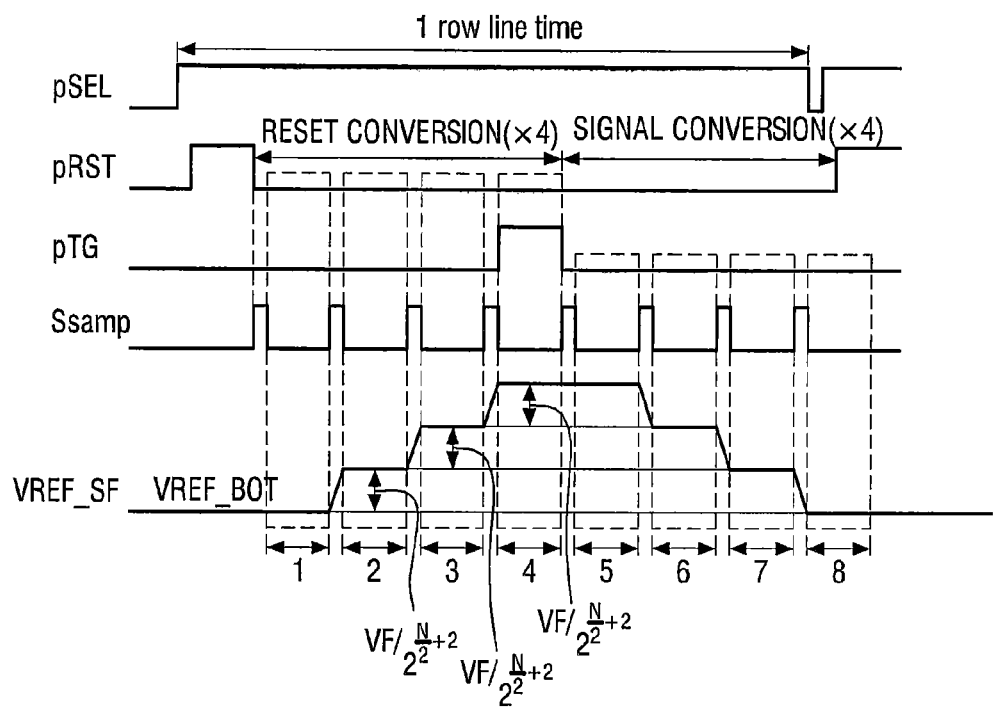
FIG. 9 is a timing diagram of the successive approximation analog-to-digital converter in FIG. 7.
Figure 10:
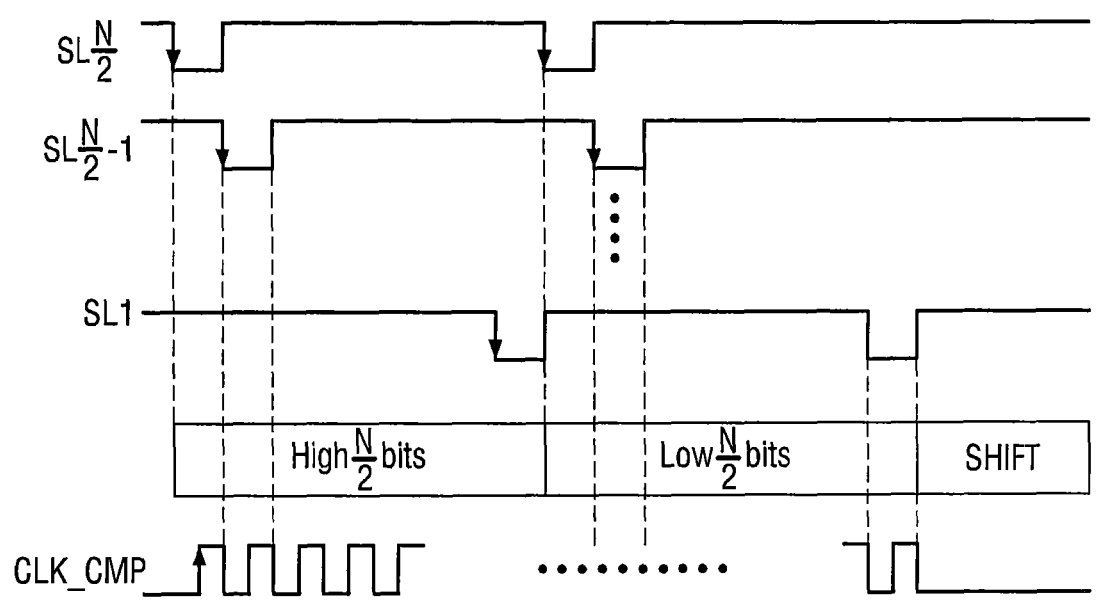
FIG. 10 is a diagram explaining sampling according to clocks in a first period in FIG. 9.

FIG. 7 is a block diagram explaining a successive approximation analog-to-digital converter in FIG. 1 according to third embodiments of the present invention, and FIG. 8 is a schematic diagram explaining a shift voltage in FIG. 7. FIG. 9 is a timing diagram of the successive approximation analog-to-digital converter in FIG. 7, and FIG. 10 is a diagram explaining sampling according to clocks in a first period in FIG. 9. For convenience in explanation, explanation of the duplicate contents to the first embodiments as described above will be omitted, and explanation will be made around different points from the first embodiment.

Referring to FIG. 7, unlike the converter 118a_1 according to the first embodiments, a successive approximation analog-to-digital converter 118a_3 according to the third embodiments is a two-stage successive approximation analog-to-digital converter. Accordingly, an N-bit digital-to-analog conversion circuit 300 may include one dummy capacitor DM-C, an N/2 dividing capacitors DV-C_1 to DV-C_N/2, ((N/2)+1) multiplexers MUX1 to MUX(N/2)+1, and N/2 registers L1 to L(N/2). Accordingly, the successive approximation analog-to-digital converter 118a_3 according to the third embodiments may first determine and store upper N/2 bits in the N/2 registers L1 to L(N/2), and then may determine lower N/2 bits. Further, the determined lower N/2 bits may also be stored in the N/2 registers L1 to L(N/2). That is, unlike the N registers of the converter 118a_1 according to the first embodiment, the N/2 registers L1 to L(N/2) may store 2 bits, respectively. The detailed description thereof will be described later.

Further, the successive approximation analog-to-digital converter 118a_3 according to the third embodiments may receive first reference voltages VREF_BOT_1 and VREF_TOP_1 that include a first lower reference voltage VREF_BOT_1 and a first upper reference voltage VREF_TOP_1 when the upper N/2 bits are determined, but may receive second reference voltages VREF_BOT_2 and VREF_TOP_2 that are different from the first reference voltages VREF_BOT_1 and VREF_TOP_1 when the lower N/2 bits are determined. The first reference voltages VREF_BOT_1 and VREF_TOP_1 include reference voltages that are equal to the reference voltages VREF_BOT and VREF_TOP in FIG. 2.

The second reference voltages VREF_BOT_2 and VREF_TOP_2 may include a second lower reference voltage VREF_BOT_2 that is higher than the first lower reference voltage VREF_BOT_1 by the level of the first reference voltage, i.e., by a level that is obtained by dividing the level VF of the reference voltage of the converter 118a_1 according to the first embodiments by $2^{(N/2)}$, and a second upper reference voltage VREF_TOP_2 that is higher than the first upper reference voltage VREF_TOP_1 by a level that is obtained by dividing the level VF of the first reference voltage by $2^{(N/2)}$. When the lower N/2 bits are determined, the second reference voltages VREF_BOT_2 and VREF_TOP_2 that are applied to the dividing capacitors may be determined through the following standard.

For example, if one of the upper N/2 bits of the input voltage Vin is determined "0" as the result of the comparison performed by the comparison circuit 320, the second lower reference voltage VREF_BOT_2 may be applied to the dividing capacitor that corresponds to "0" when the lower N/2 bits of the input voltage Vin are determined, while if one of the upper N/2 bits of the input voltage Vin is determined "1", the second upper reference voltage VREF_TOP_2 may be applied to the dividing capacitor that corresponds to "1" when the lower N/2 bits of the input voltage Vin are determined.

Referring to FIG. 8, if the number of times the input voltage Vin is sampled is 2^M (where, M is a natural number), the multiplexer 410 may select and provide one of 2^M shift voltages to the dummy capacitor DM-C. However, as can be seen from FIG. 8, unlike FIG. 3, the level that is changed whenever the shift voltages VREF_SF are sampled is the level that is obtained by dividing the level VF of the first reference voltage by 2^(N/2+M). For example, during the first sampling of the input voltage Vin, the first multiplexer may receive the first lower reference voltage VREF_BOT_1 as the shift voltage VREF_SF, and during the next sampling, the first multiplexer may provide a voltage that is higher than the first lower reference voltage VREF_BOT_1 by (first upper reference voltage−first lower reference voltage)/2^(N/2+M) as the shift voltage VREF_SF. During further next sampling, the first multiplexer may provide a voltage that is higher than the first lower reference voltage VREF_BOT_1 by 2*(first upper reference voltage−first lower reference voltage)/2^(N/2+M) as the shift voltage VREF_SF. That is, the multiplexer 410 may provide the selected shift voltage VREF_SF to a transfer device 400, and the transfer device 400 may transfer the shift voltage VREF_SF to the dummy capacitor DM-C through the first multiplexer MUX1.

Referring again to FIG. 7, the dividing capacitor DV-C may include N/2 dividing capacitors DV-C_1 to DV-C_N/2, and the N/2 dividing capacitors DV-C_1 to DV-C_N/2 may divide the level VF of the reference voltage into N/2 different offset voltages, and may divide the second reference voltage into N/2 different offset voltages. Further, the N/2 dividing capacitors DV-C_1 to DV-C_N/2 may divide the first reference voltages VREF_BOT_1 and VREF_TOP_1 TOP_1 and the second reference voltages VREF_BOT_2 and VREF_TOP_2 and may provide offset voltages to the comparison circuit 320.

Specifically, when the upper N/2 bits are determined, N/2 offset voltages may include N/2 offset voltages that are reduced in stages by ½ time, from the offset voltage having a level that is obtained by dividing the level VF of the first reference voltage by 2 to the offset voltage having a level that is obtained by dividing the level VF of the first reference voltage by 2^N. Further, if the dividing capacitor that corresponds to the MSB among the N/2 dividing capacitors DV-C_1 to DV-C_N/2, for example, the N/2-th dividing capacitor DV-C_N/2, receives the first reference voltages VREF_BOT_1 and VREF_TOP_1, the offset voltage that is obtained by dividing the level VF of the first reference voltage by 2 may be applied to the N/2-th dividing capacitor DV-C_N/2. Further, if the dividing capacitor that corresponds to the bit that is next to the MSB, for example, the (N/2−1)-th dividing capacitor DV-C_N/2−1, receives the first reference voltages VREF_BOL_1 and VREF_TOP_1, the offset voltage that is obtained by dividing the level VF of the first reference voltage by 2^2 may be applied to the (N/2−1)-th dividing capacitor DV-C_N/2−1. Further, if the dividing capacitor that corresponds to the LSB, for example, the first dividing capacitor DV-C_1, receives the first reference voltages VREF_BOT_1 and VREF_TOP_1, the offset voltage that is obtained by dividing the level VF of the first reference voltage by 2^(N/2) may be applied to the first dividing capacitor DV-C_1. The process of dividing the first reference voltages VREF_BOT_1 and VREF_TOP_1 through the dividing capacitor DV-C and providing the divided first reference voltages to the comparison circuit 320 will be described in detail later.

When the lower N/2 bits are determined, the second reference voltages VREF_BOT_2 and VREF_ TOP_2 that are different from the first reference voltages VREF_BOT_1 and VREF_TOP_1 may be divided. For example, if the MSB of the upper N/2 bits of the input voltage Vin is determined "0", the second lower reference voltage VREF_BOT 2 may be applied to the N/2-th dividing capacitor DV-C_N/2 when the lower N/2 bits of the input voltage Vin are determined, and the level of the second lower reference voltage VREF_BOT_2 may be divided into a half. Further, if the MSB of the upper N/2 bits of the input voltage Vin is determined "1", the second upper reference voltage VREF_TOP_2 may be applied to the N/2-th dividing capacitor DV-C_N/2 when the lower N/2 bits of the input voltage Vin are determined, and the level of the second upper reference voltage VREF_ TOP_2 may be divided into a half.

The dummy capacitor DM-C may receive the shift voltage VREF_SF, and may include a capacitor having the same capacitance as the LSB.

Specifically, the dummy capacitor DM-C receives the shift voltage VREF_SF that is shifted to the extent that the level VF of the reference voltage is divided by 2^(N/2+M) during every sampling of the input voltage Vin, and thus N/2 dividing capacitors DV-C_1 to DV-C_N/2 of the N-bit digital-to-analog conversion circuit 300 may be entirely offset by the LSB.

The register circuit 340 includes N/2 registers. Specifically, the register circuit 340 may include N/2 registers L1 to L(N/2), and the N/2 registers L1 to LN/2 may be respectively connected to the second to (N/2+1)-th multiplexers MUX2 to MUXN/2+1. Further, the N/2 registers L1 to L(N/2) may receive the output of the comparison circuit 320, and may successively store "0" or "1" in the order of the N/2-th register LN/2 to the first register L1. Depending on what value is stored in the respective register, the level of the offset voltage that is finally stored in the respective dividing capacitors may be determined. For example, when the upper N/2 bits are determined, if "1" is stored in the N/2-th register L(N/2), the (N/2+1)−the multiplexer MUXN/2+1 may receive a signal indicating that "1" is stored in the N/2-th register L(N/2), and may finally apply the first upper reference voltage VREF_TOP_1 to the N/2-th dividing capacitor DV-C_N/2. In contrast, if "0" is stored in the N/2-th register LN, the (N/2+1)-th multiplexer MUXN/2+1 may receive a signal indicating that "0" is stored in the N/2-th register LN/2, and may finally apply the first lower reference voltage VREF_BOT_1 to the N/2-th diving capacitor DV-C_N/2.

Further, when the lower N/2 bits are determined, if "1" is stored in the N/2-th register L(N/2), the (N/2+1)−the multiplexer MUXN/2+1 may receive a signal indicating that "1" is stored in the N/2-th register L(N/2), and may apply the second upper reference voltage VREF_TOP_2 to the N/2-th dividing capacitor DV-C_N/2. Thereafter, if "1" is output from the comparison circuit 320 as the result of the comparison of the divided offset voltage of the second upper reference voltage VREF_TOP_2 with the input voltage Vin, the second upper reference voltage VERF_TOP_2 is finally applied to the N/2-th dividing capacitor DV-C_N/2, while if "0" is output from the comparison circuit 320, the first upper reference voltage VREF_TOP_1 may be finally applied to the N/2-th dividing capacitor DV-C_N/2. In contrast, if "0" is stored in the N/2-th register (LN/2), the (N/2+1)-th multiplexer MUXN/2+1 may receive a signal indicating that "0" is stored in the N/2-th register L(N/2), and may apply the second lower reference voltage VREF_BOT_2 to the N/2−the dividing capacitor DV-C_N/2. Thereafter, if "1" is output from the comparison circuit 320 as the result of the comparison of the divided offset voltage of the second lower reference voltage VREF_BOT_2 with the input voltage Vin, the second lower reference voltage VERF_BOT_2 is finally applied to the N/2-th dividing capacitor DV-C_N/2, while if "0" is output from the comparison circuit 320, the first lower reference voltage VREF_BOT_1 may be finally applied to the N/2-th dividing capacitor DV-C_N/2.

Referring to FIG. 9, a timing diagram of the successive approximation analog-to-digital converter 118a_3 according to the third embodiments is illustrated. For the timing diagram of FIG. 9, it is assumed that the input voltage Vin is oversampled four times. Of course, the number of times the input voltage is oversampled according to some embodiments of the present invention is not limited to four times.

The timing diagram of the successive approximation analog-to-digital converter 118a_3 according to the third embodiments may be similar to the timing diagram of the successive approximation analog-to-digital converter 118a_1 according to the first embodiment. However, in the case of the third embodiment, it can be known that the conversion width of the shift voltage VREF_SF that is shifted and provided whenever the input voltage Vin is sampled corresponds to the first reference voltage level VF/2^(N/2+2). That is, unlike the converter 118a_1 according to the first embodiments of FIG. 4, the converter 118a_3 according to the third embodiments of FIG. 9 performs sampling in two stages, and thus the conversion width of the shift voltage VREF_SF (first reference voltage level VF/2^(N/2+2)) is different from the conversion width of the shift voltage of the converter according to the first embodiments 118a_1 (reference voltage level VF/2^2).

Referring to FIG. 10, a detailed timing diagram for a first period in FIG. 9 is illustrated.

According to the timing diagram of FIG. 10, unlike the timing diagram of FIG. 5, one of the upper N/2 bits and one of the lower N/2 bits are stored in one register, the respective registers operate once when the upper N/2 bits are determined, and operate once again when the lower N/2 bits are determined. Specifically, the comparison circuit 320 may receive the offset voltage that is obtained by dividing the level VF of the first reference voltage by 2 from the N/2-th dividing capacitor DV-C_N/2 and may receive the common mode voltage Vcm from the common mode voltage terminal 310. At this time, a comparison clock signal CLK_CMP that is applied to the comparison circuit 320 goes to a high state, and thus the comparison circuit 320 compares the offset voltage that is obtained by dividing the level VF of the first reference voltage by 2 with the common mode voltage Vcm. If the offset voltage is higher than the common mode voltage Vcm, the comparison circuit 320 may output "0", while if the offset voltage is lower than the common mode voltage Vcm, the comparison circuit 320 may output "1". The comparison clock signal CLK_CMP goes to a low state when the next register signal goes to a low state to return to a standby state for the next comparison operation. Further, the output of the comparison circuit 320 may be stored in the N/2-th register L(N/2). If "0" is provided to the N/2-th register L(N/2), the N/2-th register L(N/2) may make the (N/2+1)-th multiplexer MUXN/2+1 select the first lower reference voltage VREF_BOT_1, while if "1" is provided to the N/2-register L(N/2), the N/2-th register L(N/2) may make the (N/2+1)-th multiplexer MUXN/2+1 select the first upper reference voltage VREF_TOP_1. Accordingly, if "0" is stored in the N/2-register L(N/2), the first lower reference voltage VREF_BOT_1 may be finally applied to the N/2-th dividing capacitor DV-C_N/2, while if "1" is stored in the N/2-th register L(N/2), the first upper reference voltage VREF_TOP_1 may be finally applied to the N/2-th dividing capacitor DV-C_N/2. As can be known through the above-described description, the MSB of the input voltage Vin is stored in the N/2-th register L(N/2).

If the N/2-th register signal SLN/2 goes again to a high state, the (N/2−1)-th register signal SLN/2−1 that is applied to the N/2-th multiplexer MUXN/2 may go to a low state. Further, if the (N/2−1)-th register signal SLN/2−1 goes to a low state, the N/2-th multiplexer MUXN/2 may select and provide the first upper reference voltage VREF_TOP_1 to the (N/2−1)-th dividing capacitor DV-C_N/2−1, and the (N/2−1)-th dividing capacitor DV-C_N/2−1 may divide the level VF of the reference voltage into ¼. That is, if the first upper reference voltage VREF_TOP_1 is provided to the (N/2−1)-th dividing capacitor DV-C_N/2−1, an offset voltage that is obtained by dividing the level VF of the first reference voltage by 4 may be applied to the (N/2−1)-th dividing capacitor Dv-C_N/2−1, and such an offset voltage may be provided to the comparison circuit 320.

The comparison circuit 320 may receive the offset voltage that is obtained by dividing the level VF of the first reference voltage by 4 from the (N/2−1)-th dividing capacitor DV-C_N/2−1 and may receive the common mode voltage Vcm from the common mode voltage terminal 310. At this time, the comparison clock signal CLK_CMP that is applied to the comparison circuit 320 goes again to a high state, and thus the comparison circuit 320 compares the offset voltage that is obtained by dividing the level VF of the first reference voltage by 4 with the common mode voltage Vcm. If the offset voltage is higher than the common mode voltage Vcm, the comparison circuit 320 may output "0", while if the offset voltage is lower than the common mode voltage Vcm, the comparison circuit 320 may output "1". The comparison clock signal CLK_CMP goes to a low state when the next register signal goes to a low state to return to a standby state for the next comparison operation. Further, the output of the comparison circuit 320 may be stored in the (N/2−1)-th register L(N/2)−1. If "0" is provided to the (N/2−1)-th register L(N/2)−1, the (N/2−1)-th register may make the N/2-th multiplexer MUXN/2 select the first lower reference voltage VREF_BOT_1, while if "1" is provided to the (N/2−1)-register L(N/2)−1, the (N/2−1)-th register L(N/2)−1 may make the N/2-th multiplexer MUXN/2 select the first upper reference voltage VREF_TOP_1. Accordingly, if "0" is stored in the (N/2−1)-th register L(N/2)−1, the first lower reference voltage VREF_BOT_1 may be finally applied to the (N/2−1)-th dividing capacitor DV-C_N/2−1, while if "1" is stored in the (N/2−1)-th register L(N/2)−1, the first upper reference voltage VREF_TOP_1 may be finally applied to the (N/2−1)-th dividing capacitor DV-C_N/2−1. As can be known through the above-described description, the bit next to the MSB of the input voltage Vin is stored in the (N/2−1)-th register L(N/2)−1.

As described above, the upper N/2 bits may be successively determined through the comparison process, and the determined bits may be stored in the first to the N/2-th registers L(N/2).

Next, the lower N/2 bits may be determined through the following process.

First, if the upper N/2 bits are determined, the N/2-th register L(N/2) goes again to a low state, and if "1" is stored in the N/2-th register L(N/2), the (N/2+1)-the multiplexer MUXN/2+1 may receive a signal indicating that "1" is stored in the N/2-th register L(N/2), and may apply the second upper reference voltage VREF_TOP_2 to the N/2-th dividing capacitor DV-C_N/2. Thereafter, if "1" is output from the comparison circuit 320 as the result of the comparison of the divided offset voltage of the second upper reference voltage VREF_TOP_2 ((second upper reference voltage VREF_TOP_2)−(first lower reference voltage VREF_BOT_2))/2 with the common mode voltage Vcm, the second upper reference voltage VERF_TOP_2 is finally applied to the N/2-th dividing capacitor DV-C_N/2, while if "0" is output from the comparison circuit 320, the first upper reference voltage VREF_TOP_1 may be finally applied to the N/2-th dividing capacitor DV-C_N/2. In contrast, if "0" is stored in the N/2-th register L(N/2), the (N/2+1)-th multiplexer MUXN/2+1 may receive a signal indicating that "0" is stored in the N/2-th register L(N/2), and may apply the second lower reference voltage VREF_BOT_2 to the N/2−the dividing capacitor DV-C_N/2. Thereafter, if "1" is output from the comparison circuit 320 as the result of the comparison of the divided offset voltage of the second lower reference voltage VREF_BOT_2 ((second upper reference voltage VREF_TOP_2)−(first lower reference voltage VREF_BOT_2))/2 with the common mode voltage Vcm, the second lower reference voltage VERF_BOT_2 is finally applied to the N/2-th dividing capacitor DV-C_N/2, while if "0" is output from the comparison circuit 320, the first lower reference voltage VREF_BOT_1 may be finally applied to the N/2-th dividing capacitor DV-C_N/2.

Through the above-described process, the lower N/2 bits may be successively determined, and the determined bits may be stored in the first to N/2-th registers L(N/2).

As described above, through four times oversampling with respect to the reset signal and the image signal, the input voltage Vin may be converted into a digital code of (N+2) bits. That is, according to the successive approximation analog-to-digital converter 118a_3 according to the third embodiments of the present invention, the input voltage Vin may be oversampled 4 times to be converted into (N+2)-bit digital signal.

Figure 11:
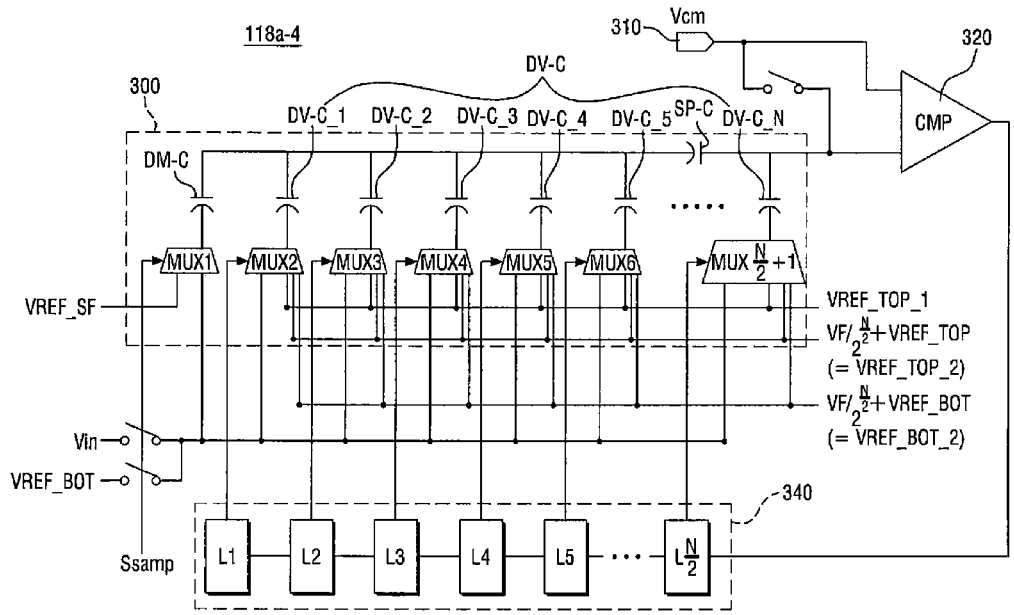
FIG. 11 is a block diagram explaining a successive approximation analog-to-digital converter in FIG. 1 according to fourth embodiments of the present invention.

Hereinafter, referring to FIG. 11, a successive approximation analog-to-digital converter of FIG. 1 according to fourth embodiments of the present invention will be described. FIG. 11 is a block diagram explaining a successive approximation analog-to-digital converter in FIG. 1 according to fourth embodiments of the present invention. For convenience in explanation, explanation of the duplicate contents to the third embodiments as described above will be omitted.

Referring to FIG. 11, a successive approximation analog-to-digital converter 118a_4 according to fourth embodiments of the present invention may further include one dividing capacitor SP-C between N/2 dividing capacitors DV-C_1 to DV-C_N/2.

The dividing capacitor SP-C may serve to divide the N/2 dividing capacitors DV-C_1 to DV-C_N/2 into two groups, and the capacitance of the dividing capacitor SP-C may include $(2^{(N/4)})/((2^{(N/4)})-1)C$. Since the dividing capacitor SP-C exists to reduce the maximum capacitance values of the divided groups, necessary capacitor areas can be reduced. The more detailed explanation of the dividing capacitor SP-C will be omitted.

Figure 12:
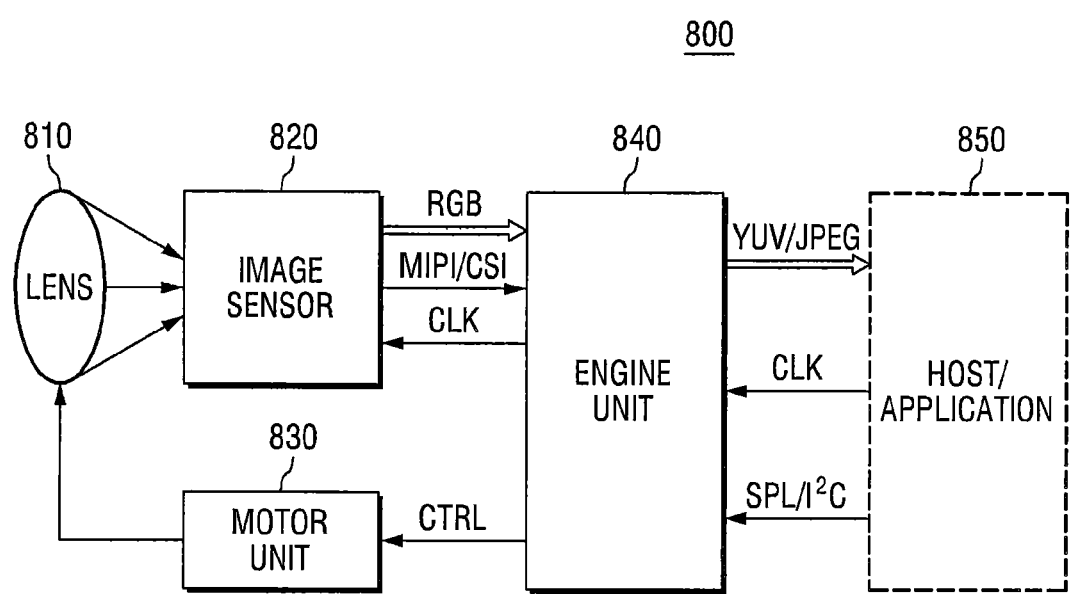
FIG. 12 is a block diagram illustrating an example of an image sensor according to some embodiments of the present invention, for example, an example in which an image sensor is applied to a digital camera.

FIG. 12 is a block diagram illustrating an example of an image sensor according to some embodiments of the present invention, for example, an example in which an image sensor is applied to a digital camera.

Referring to FIG. 12, a digital camera 800 may include a lens 810, an image sensor 820, a motor circuit 830, and an engine circuit 540. The image sensor 820 includes an image sensor that uses the above-described offset-compensated reference voltage as a reference voltage during ADC conversion.

The lens 810 condenses incident light into a light receiving region of the image sensor 820. The image sensor 620 may generate RGB data of a Bayer pattern based on the light that is incident through the lens 810. The image sensor 820 may provide the RGB data based on the clock signal CLK.

According to some embodiments, the image sensor 820 may interface with the engine circuit 840 through an MIPI (Mobile Industry Processor Interface) and/or a CSI (Camera Serial Interface).

The motor circuit 830 may adjust a focus of the lens 810 or perform shuttering in response to the control signal CTRL received from the engine circuit 840. The engine circuit 840 controls the image sensor 820 and the motor circuit 830. Further, the engine circuit 840 may generate YUV data that includes a luminance component, a difference between the luminance component and a blue component, and a difference between the luminance component and a red component or may generate compressed data, for example, JPEG (Joint Photography Experts Group) data based on the RGB data received from the image sensor 820.

The engine circuit 840 may be connected to a host/application 850, and the engine circuit 840 may provide the YUV data or JPEG data to the host/application 850 based on the master clock MCLK. Further, the engine circuit 840 may interface with the host/application 850 through an SPI (Serial Peripheral Interface) and/or an I2C (Inter Integrated Circuit).

Figure 13:
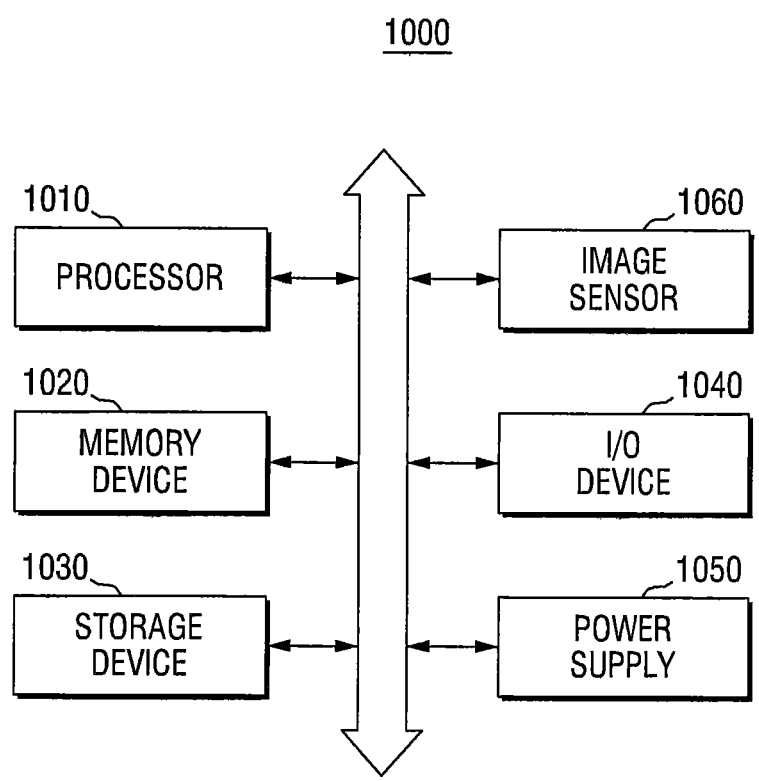
FIG. 13 is a block diagram illustrating an example of an image sensor according to some embodiments of the present invention, for example, an example in which an image sensor is applied to a computing system.

FIG. 13 is a block diagram illustrating an example of an image sensor according to some embodiments of the present invention, for example, an example in which an image sensor is applied to a computing system.

Referring to FIG. 13, a computing system 1000 includes a processor 1010, a memory device 1020, a storage device 1030, an input/output (I/O) device 1040, a power supply 1050, and an image sensor 1060.

The image sensor 1060 includes an image sensor that uses the above-described offset-compensated reference voltage as a reference signal during ADC conversion. On the other hand, although not illustrated in FIG. 13, the computing system 1000 may further include ports that can communication with a video card, a sound card, a memory card, a USB device, or other electronic devices.

The processor 1010 may perform specific computations or tasks. According to some embodiments, the processor 1010 may be a microprocessor or a CPU (Central Processing Circuit).

The processor may perform communication with the memory device, the storage device 1030, and the I/O device 1040 through an address bus, a control bus, and a data bus.

According to some embodiments, the processor 1010 may be connected to an extension bus, such as PCI (Peripheral Component Interconnect) bus. The memory device 1020 may store data that is required to operate the computing system 1000.

For example, the memory device 1020 may be implemented by a DRAM, a mobile DRAM, an SRAM, a PRAM, an FRAM, an RRAM and/or an MRAM. The storage device 1030 may include an SSD (Solid State Drive), an HDD (Hard Disk Drive), and a CD-ROM.

The I/O device 1040 may include an input means, such as a keyboard, a keypad, and a mouse, and an output means, such as a printer and a display. The power supply 1050 may supply an operation voltage that is required to operate the electronic device 1000.

The image sensor 1060 may be connected to the processor 1010 through the buses or other communication links to perform communication with the processor 1010. As described above, the image sensor 1060 may generate accurate image data through offset compensation with respect to the reference voltage. The image sensor 1060 may be integrated into one chip together with the processor 1010, or may be integrated into a chip that is different from the chip of the processor 1010.

On the other hand, the computing system 1000 may be analyzed as all computing systems using image sensors. For example, the computing system 1000 may include a digital camera, a mobile phone, a PDA (Personal Digital Assistants), a PMP (Portable Multimedia Player), a smart phone, or a tablet PC.

Figure 14:
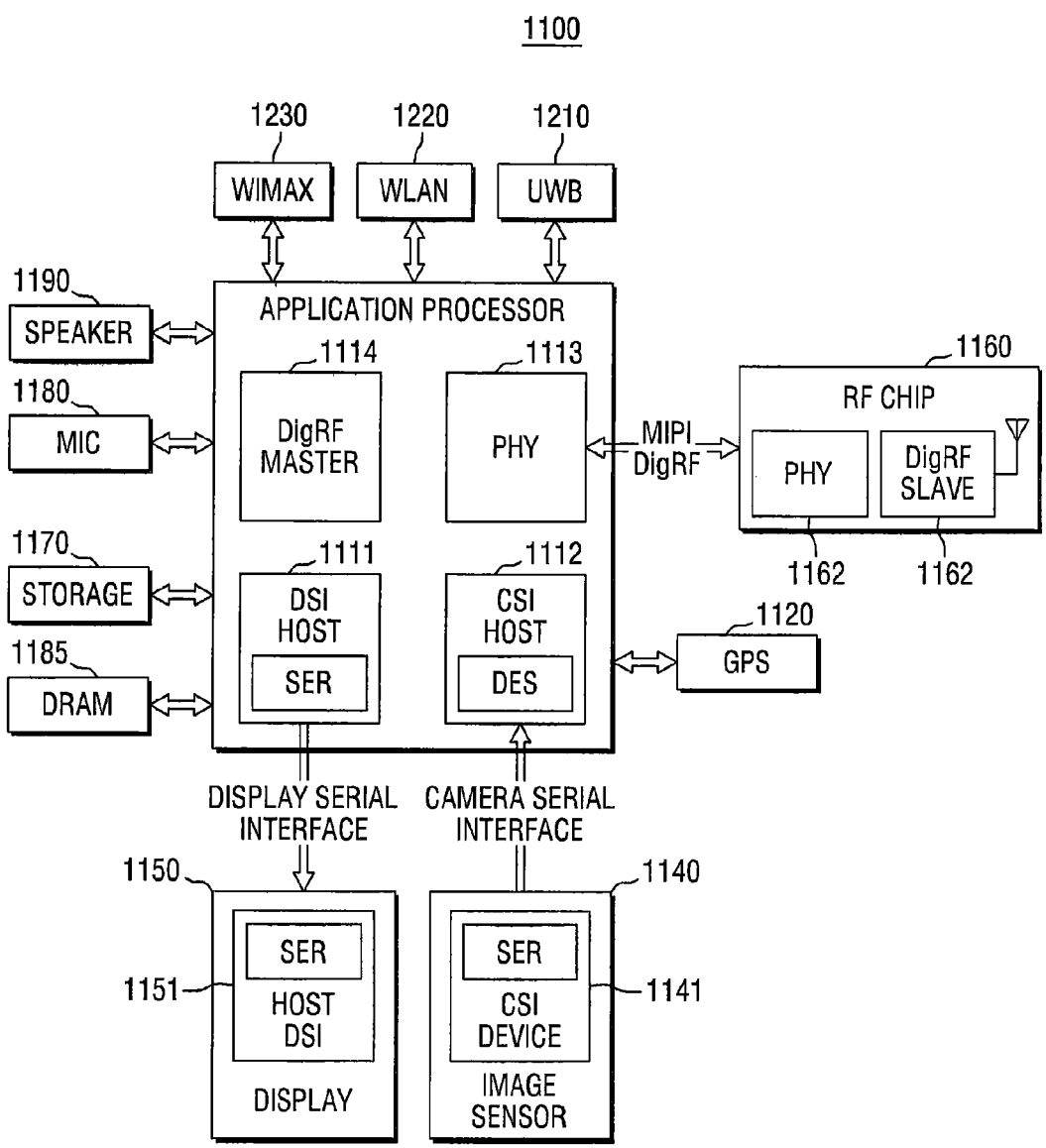
FIG. 14 is a block diagram illustrating an example of an interface that is used in the computing system of FIG. 13.

FIG. 14 is a block diagram illustrating an example of an interface that is used in the computing system of FIG. 13.

Referring to FIG. 14, a computing system 1100 may be implemented by a data processing device that can use or support an MIPI interface, and may include an application processor 1110, an image sensor 1140, and a display 1150.

A CSI host 1112 of the application processor 1110 may perform serial communication with a CSI device 1141 of the image sensor 1140 through a CSI (Camera Serial Interface). In some embodiments, the CSI host 1112 may include a deserializer DES, and the CSI device 1141 may include a serializer SER. A DSI host 1111 of the application processor 1110 may perform serial communication with a DSI device 1151 of the display 1150 through a DSI (Display Serial Interface). In some embodiments, the DSI host 1111 may include a serializer SER, and the DSI device 1151 may include a deserializer DES. Further, the computing system 1100 may further include an RF (Radio Frequency) chip 1160 that can perform communication with the application processor 1110. A PHY 1113 of the computing system 1100 and a PHY 1161 of the RF chip 1160 may perform data transmission/reception along MIPI (Mobile Industry Processor Interface) DigRF.

Further, the application processor 1110 may further include a DigRF mater 1114 that controls data transmission/reception according to the MIPI DigRF of the PHY 1161. On the other hand, the computing system 1100 may include a GPS (Global Positioning System) 1120, a storage 1170, a microphone 1180, a DRAM (Dynamic Random Access Memory) 1185, and a speaker 1190. Further, the computing system 1100 may perform communication using UWB (Ultra Wideband) 1120, WLAN (Wireless Local Area Network) 1220, and WIMAX (Worldwide Interoperability for Microwave Access) 1230. However, the above-described structure and interface of the computing system 1100 are merely exemplary, and the present invention is not limited thereto.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An analog-to-digital converter comprising:
   a digital-to-analog converter comprising a capacitor divider network comprising a plurality of dividing capacitors and a dummy capacitor, the digital-to-analog converter configured to selectively apply an input voltage and a reference voltage to the dividing capacitors and to selectively apply the input voltage and a shift voltage to the dummy capacitor;
   a comparison circuit configured to compare an output of the capacitor divider network and a common mode voltage; and
   a shift voltage generator circuit configured to generate the shift voltage.

2. The analog-to-digital converter of claim 1, wherein the shift voltage generator circuit is configured to vary the shift voltage for different samples of the input voltage.

3. The analog-to-digital converter of claim 2, wherein the shift voltage generator circuit is configured to change the shift voltage for succeeding samples by an amount corresponding to $1/(2^M)$ times the reference voltage to support $2^M$ oversampling of the input voltage.

4. The analog-to-digital converter of claim 1, wherein respective ones of the dividing capacitors correspond to respective bits of a digital output of the analog-to-digital converter and wherein the dummy capacitor has a capacitance substantially the same as a capacitance of a one of the dividing capacitors corresponding to a least significant bit (LSB) of the digital output.

5. The analog-to-digital converter of claim 1, wherein the digital-to-analog converter comprises a plurality of multiplexers, respective ones of which are coupled to respective ones of the dividing capacitors and the dummy capacitor.

6. The analog-to-digital converter of claim 5, further comprising a register coupled to an output of the comparison circuit and configured to provide respective control signals to respective ones of the multiplexers.

7. The analog-to-digital converter of claim 1, wherein the capacitor divider network is a split capacitor divider circuit comprising a bridge capacitor coupling two groups of the dividing capacitors.

8. The analog-to-digital converter of claim 1, wherein the digital-to-analog converter is a multi-stage digital-to-analog converter configured to selectively apply first and second reference voltages to the dividing capacitors for respective first and second groups of bits of a digital output of the analog-to-digital converter.

9. The analog-to-digital converter of claim 8:
   wherein the first reference voltage comprises a first lower reference voltage and a first upper reference voltage that is higher than the first lower reference voltage by a level of the first reference voltage; and
   wherein the second reference voltage comprises a second lower reference voltage that is higher than the first lower reference voltage by a level that is obtained by dividing the level of the first reference voltage by $2^{(N/2)}$ and a second upper reference voltage that is higher than the first upper reference voltage by a level that is obtained by dividing the level of the first reference voltage by $2^{(N/2)}$,
   wherein N is a number of bits of the digital output.

10. The analog-to-digital converter of claim 9, wherein if one of the upper N/2 bits of the input voltage is determined "0" as the result of the comparison performed by the comparison circuit, the second lower reference voltage is applied to the dividing capacitor that corresponds to "0" when the lower N/2 bits of the input voltage are determined.

11. An analog-to-digital conversion method comprising:
   applying a first voltage sample to dividing capacitors and a dummy capacitor of a capacitor divider network of a digital-to-analog converter;
   applying a first shift voltage to the dummy capacitor;
   sequentially applying a reference voltage to respective ones of the dividing capacitors and comparing corresponding respective outputs of the capacitor divider network to a common mode voltage to generate a first multi-bit digital output value;
   applying a second voltage sample to dividing capacitors and the dummy capacitor of a capacitor divider network of the digital-to-analog converter;

applying a second shift voltage different from the first shift voltage to the dummy capacitor; and sequentially applying the reference voltage to respective ones of the dividing capacitors and comparing corresponding respective outputs of the capacitor divider network to the common mode voltage to generate a second multi-bit digital output value.

12. The analog-to-digital converter of claim 11, wherein if one of the upper N/2 bits of the input voltage is determined "1" as the result of the comparison performed by the comparison circuit, the second upper reference voltage is applied to the dividing capacitor that corresponds to "1" when the lower N/2 bits of the input voltage are determined.

13. The method of claim 11, wherein the second shift voltage differs from the first shift voltage by an amount corresponding to $1/(2^M)$ times the reference voltage to support $2^M$ oversampling.

14. The method of claim 11, wherein respective ones of the dividing capacitors correspond to respective bits of a digital output of the analog-to-digital converter and wherein the dummy capacitor has a capacitance substantially the same as a capacitance of a one of the dividing capacitors corresponding to a least significant bit (LSB).

15. An analog-to-digital converter comprising:
- a digital-to-analog converter comprising a capacitor divider network and configured to selectively apply an input voltage, a reference voltage and a shift voltage to the capacitor divider network;
- a comparison circuit configured to compare an output of the capacitor divider network and a common mode voltage to generate a digital output; and
- a shift voltage generator circuit configured to generate the shift voltage.

16. The analog-to-digital converter of claim 15, wherein the shift voltage generator circuit is configured to vary the shift voltage for different samples of the input voltage.

17. The analog-to-digital converter of claim 16, wherein the shift voltage generator circuit is configured to change the shift voltage for succeeding samples of the input voltage by an amount corresponding to $1/(2^M)$ times the reference voltage to support $2^M$ oversampling of the input voltage.

18. The analog-to-digital converter of claim 15, wherein the capacitor divider network comprises a dummy capacitor and respective dividing capacitors corresponding to respective bits of the digital output and wherein the digital-to-analog converter is configured to selectively apply the input voltage and the reference voltage to the dividing capacitors and to selectively apply the input voltage and the shift voltage to the dummy capacitor.

19. The analog-to-digital converter of claim 18, wherein the dummy capacitor has a capacitance substantially the same as a capacitance of one of the dividing capacitors corresponding to an LSB of the digital output.

20. The analog-to-digital converter of claim 15, further comprising a register coupled an output of the comparison circuit and to an output of the digital-to-analog converter.

* * * * *